United States Patent
Kim

(10) Patent No.: US 7,989,858 B2
(45) Date of Patent: Aug. 2, 2011

(54) IMAGE SENSOR AND METHOD OF FABRICATING THE SAME

(75) Inventor: Tae Gyu Kim, Masan-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 614 days.

(21) Appl. No.: 12/045,331

(22) Filed: Mar. 10, 2008

(65) Prior Publication Data
US 2008/0224250 A1 Sep. 18, 2008

(30) Foreign Application Priority Data
Mar. 14, 2007 (KR) .................. 10-2007-0024917

(51) Int. Cl.
*H01L 31/062* (2006.01)
(52) U.S. Cl. ........ 257/292; 257/233; 257/291; 257/293; 257/E27.133
(58) Field of Classification Search .................. 257/233, 257/291, 292, 293, E27.133
See application file for complete search history.

(56) References Cited

U.S. PATENT DOCUMENTS
2008/0079102 A1* 4/2008 Chen et al. ............. 257/431

FOREIGN PATENT DOCUMENTS

| JP | 61-251068 A | 11/1986 |
|----|----|----|
| JP | 2000-156488 A | 6/2000 |
| KR | 10-2003-0001116 A | 1/2003 |
| KR | 10-2004-0042830 | 12/2005 |
| KR | 10-2006-7017146 | 11/2006 |

* cited by examiner

*Primary Examiner* — Tan N Tran
(74) *Attorney, Agent, or Firm* — Saliwanchik, Lloyd & Eisenschenk

(57) ABSTRACT

Provided are an image sensor and a method of fabricating the same. The image sensor according to an embodiment includes a semiconductor substrate including a circuit region; a metal interconnection layer including a metal interconnection and an interlayer dielectric on the semiconductor substrate; a plurality of first pixel isolation layers on the interlayer dielectric, each of the first pixel isolation layers protruding above a top surface of the interlayer dielectric; and a light receiving portion between the first pixel isolation layers, the light receiving portion including protruding portions along sidewalls of the first pixel isolation layers.

18 Claims, 3 Drawing Sheets

IMAGE SENSOR AND METHOD OF FABRICATING THE SAME

CROSS-REFERENCE TO RELATED APPLICATION

The present application claims the benefit under 35 U.S.C. §119 of Korean Patent Application No. 10-2007-0024917, filed Mar. 14, 2007, which is hereby incorporated by reference in its entirety.

BACKGROUND

In general, an image sensor is a semiconductor device for converting optical images into electrical signals. The image sensor is mainly classified as a charge coupled device (CCD) image sensor or a complementary metal oxide silicon (CMOS) image sensor (CIS).

A CIS includes a photodiode and a MOS transistor in a unit pixel. The CIS sequentially detects electric signals of each unit pixel in a switching manner to realize an image.

The photodiode region converts a light signal into an electrical signal, and the transistor processes the electrical signal. Generally, in a CIS, the photodiode and the transistor are horizontally disposed on a semiconductor substrate.

According to a horizontal type CMOS image sensor, the photodiode and the transistor are horizontally adjacent to each other on the semiconductor substrate. Therefore, an additional region within each pixel area is required for forming the photodiode.

BRIEF SUMMARY

Embodiments of the present invention relate to an image sensor that provides vertical integration of a transistor circuit and a photodiode, and a method of manufacturing the image sensor.

In one embodiment, an image sensor includes: a semiconductor substrate including a circuit region; a metal interconnection including a plurality of metal interconnections and an interlayer dielectric on the semiconductor substrate; a plurality of first pixel isolation layers on the interlayer dielectric, each of the first pixel isolation layers protruding above a top surface of the interlayer dielectric; and a light receiving portion between the first pixel isolation layers, the light receiving portion including a protruding portion along sidewalls of the first pixel isolation layers.

A method of fabricating an image sensor according to one embodiment includes: forming a metal interconnection layer including a plurality of metal interconnections and an interlayer dielectric on a semiconductor substrate including a circuit region; forming a plurality of first pixel isolation layers on the interlayer dielectric; forming a light receiving portion between the first pixel isolation layers, the light receiving portion including a protruding portion along sidewalls of the first pixel isolation layers; and forming a first upper electrode on the light receiving portion.

The details of one or more embodiments are set forth in the accompanying drawings and the description below. Other features will be apparent from the description and drawings, and from the claims.

DETAILED DESCRIPTION

Hereinafter, an image sensor and a method of fabricating the same will be described in detail with reference to the accompanying drawings. When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 7:
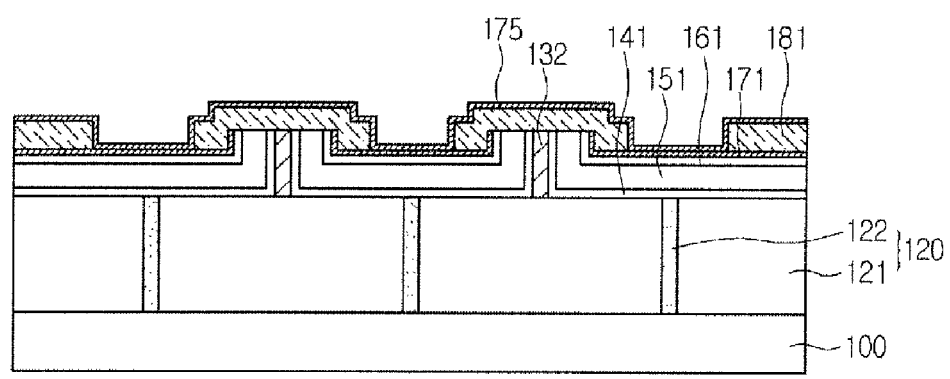

FIG. 7 is a cross-sectional view of an image sensor at a stage of the fabricating process according to an embodiment.

Referring to FIG. 7, an image sensor can include a semiconductor substrate 100, a metal interconnection layer 120, a plurality of first pixel isolation layers 132, and a light receiving portion (including, for example, elements 141, 151, 161). The semiconductor substrate 100 includes a circuit region (not shown) with transistors (not shown). The metal interconnection layer 120 can include a plurality of metal interconnections 122 and an interlayer dielectric 121 disposed on the semiconductor substrate 100. The first pixel isolation layers 132 are disposed on the interlayer dielectric 121 and upwardly protrude from the interlayer dielectric 121. The light receiving portion is in contact with the metal interconnections 122 between the first pixel isolation layers 132.

According to an embodiment, the first pixel isolation layer 132 can be formed of an oxide layer or a nitride layer.

Since the light receiving portion is vertically stacked over the semiconductor substrate 100 including the circuit region, a fill factor of the light receiving portion can be improved. The light receiving portion is separated by a unit pixel using the first pixel isolation layers 132 to inhibit generation of crosstalk and noise.

The light receiving portion can include a first conductive type conduction layer 141, an intrinsic layer 151, and a second conductive type conduction layer 161.

The first conductive type conduction layer 141 can be disposed on the interlayer dielectric 121 such that it is connected to the metal interconnection 122 between the first pixel isolation layers 132. The intrinsic layer 151 can be disposed on the first conductive type conduction layer 141. The second conductive type conduction layer 161 can be disposed on the intrinsic layer 151.

A first upper electrode 171 can be disposed on the second conductive type conduction layer 161 between the first pixel isolation layers 132. The first upper electrode 171 can serve as a hard mask of the light receiving portion. The first upper electrode 171 may be a transparent electrode which has high light transmittance and high conductivity. For example, the first upper electrode 171 may be formed of indium tin oxide (ITO) or cadmium tin oxide (CTO).

Figure 6:
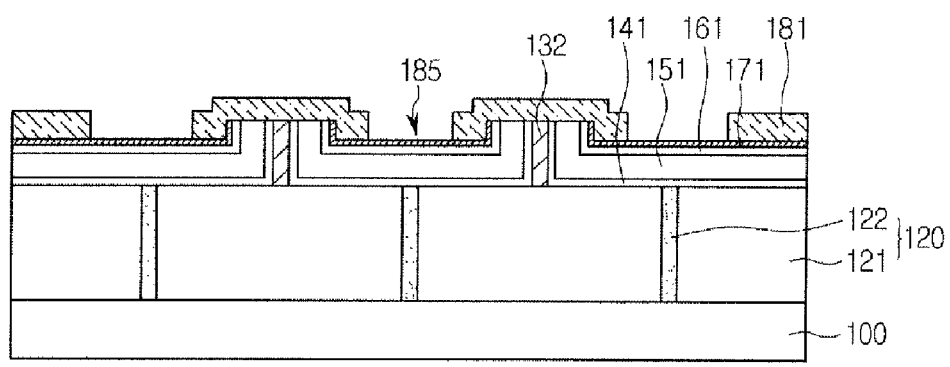

Referring to FIGS. 6 and 7, second pixel isolation layers 181 can be disposed over the semiconductor substrate 100 including the first pixel isolation layers 132 and the light receiving portion. The second pixel isolation layer 181 includes an opening 185. The opening 185 exposes a portion of the first upper electrode 171, while a periphery region of a unit pixel including the first pixel isolation layer 132 is covered.

According to one embodiment, the second pixel isolation layer 132 can be formed of an oxide layer or a nitride layer.

A second upper electrode 175 can be disposed over the semiconductor substrate 100 including the second pixel isolation layers 181 and the first upper electrode 171. The second upper electrode 175 may be a transparent electrode which has high light transmittance and high conductivity. For example, the second upper electrode 175 may be formed of ITO or CTO.

A method of fabricating an image sensor according to an embodiment will be described with reference to FIGS. 1 to 7.

Figure 1:
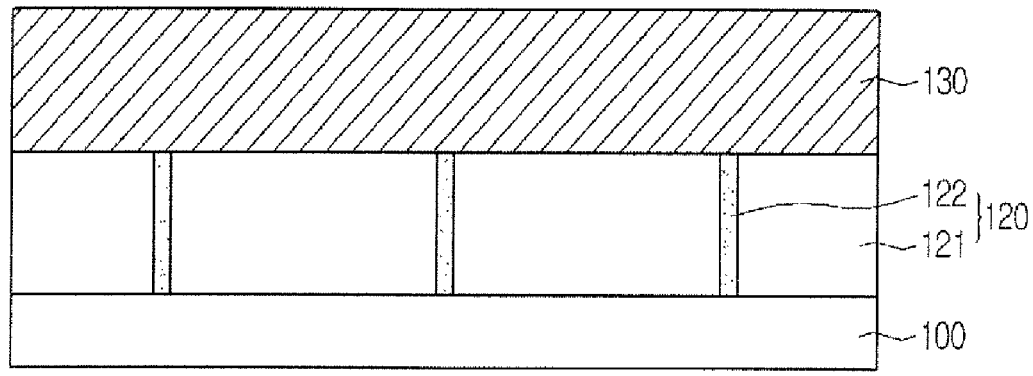
FIGS. 1 to 7 are cross-sectional views illustrating processes of fabricating an image sensor according to an embodiment.

Referring to FIG. 1, a metal interconnection layer 120 including a plurality of metal interconnections 122 and an interlayer dielectric 121 can be formed on a semiconductor substrate 100 including a circuit region (not shown).

Before forming the metal interconnection layer 120, a device isolation layer (not shown) can be formed in the semiconductor substrate 100 to define an active region and a field region. The circuit region (not shown) can then be formed in order to form a unit pixel on the semiconductor substrate 100. In an embodiment, the circuit region includes a transfer transistor, a reset transistor, a driver transistor, and a select transistor. The circuit region is connected to a photodiode (to be described below) to convert a received light charge into an electrical signal.

The metal interconnection layer 120 including a plurality of metal interconnections 122 is formed on the semiconductor substrate 100 including the circuit region in order to connect the circuit region to power interconnections and signal interconnections, including from the photodiode (light receiving portion). The metal interconnection layer 120 may include the plurality of layers formed on the semiconductor substrate 100.

The metal interconnection layer 120 includes the interlayer dielectric 121 and the metal interconnections 122, which pass through the interlayer dielectric 121. The metal interconnections 122 are formed for the unit pixel. Each unit pixel is connected to the circuit region formed on the semiconductor substrate 100. The metal interconnections 122 may be formed of various conductive materials including a metal, an alloy, or a silicide. For example, the metal interconnection 122 can be formed of aluminum, copper, cobalt, or tungsten.

Figure 2:
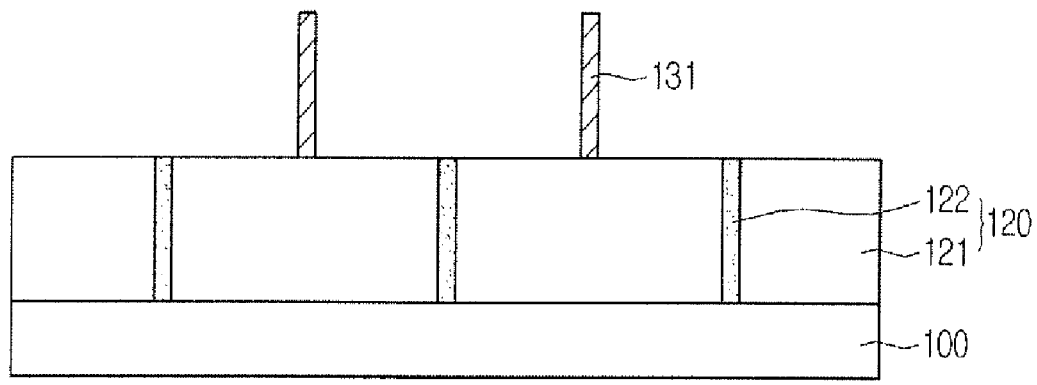

Referring to FIG. 2, a first pixel isolation layer 131 can be formed on the interlayer dielectric 121 after forming the metal interconnections 122 connected to the circuit region of the semiconductor substrate 100. Hence, a light receiving portion (to be described later) is separated according to unit pixel using the first pixel isolation layer 131.

Referring back to FIG. 1, an insulating layer 130 can be formed on the metal interconnection layer 120 in order to form the first pixel isolation layer 131. For example, the insulating layer 130 may be formed of an oxide layer or a nitride layer.

A photoresist pattern (not shown) can be formed on the insulating layer 130. The first pixel isolation layer 131, which protrudes above a top surface of the interlayer dielectric 121, is formed by etching the insulating layer 130 using the photoresist pattern as an etch mask.

Referring again to FIG. 2, the first pixel isolation layer 131 is formed on the interlayer dielectric 121 between the metal interconnections 122 such that it is not in contact with the metal interconnection 122. Each first pixel isolation layer 131 is formed between the metal interconnections 122 for each unit pixel. Hence, a photodiode connected to the metal interconnection 122 is separated according to unit pixel using the first pixel isolation layer 131.

A photodiode formed within the unit pixel defined by the first pixel isolation layer 131 serves as the light receiving portion and can cover the sidewalls of the first pixel isolation layer 131.

In one embodiment, a lower electrode (not shown) of the photodiode can be formed on the metal interconnection 122 before forming the photodiode. For example, the lower electrode may be formed of metals such as Cr, Ti, TiW, and Ta. Of course, the lower electrode may not be formed.

A photodiode can be formed on the metal interconnection 120 upon which the first pixel isolation layer 131 is formed. The photodiode formed on the metal interconnection layer 120 receives light incident from the outside to electrically convert the incident light into an electric signal and store the converted electric signal. In the described embodiments, a PIN diode is used as the photodiode. However, embodiments are not limited thereto.

A PIN diode can be described as a diode with an intrinsic amorphous silicon layer between an n-type amorphous silicon layer and a p-type amorphous silicon layer. The performance of a photodiode depends on its efficiency of converting incident light into an electric type, and its charge capacitance. In general, electric charges of a typical photodiode are generated and stored in a depletion region provided by a hetero junction such as P-N, N-P, N-P-N, and P-N-P, which are conventional photodiode structures used in horizontal type CIS. In contrast, because a PIN diode includes an intrinsic region, the entire intrinsic amorphous silicon layer between the n-type amorphous silicon layer and the p-type amorphous silicon layer can provide a depletion region. Therefore, in a PIN diode, electric charges are advantageously generated and stored as compared to a typical photodiode.

As described above, according to embodiments of the present invention, a PIN diode can be used as the photodiode. Although not expressly described in the subject disclosure, the PIN diode may be formed instead with a structure such as I-P or N-I-P. In the described embodiments, a first conductive type conduction layer 141 can be n-type amorphous silicon serving as an N-layer of the PIN photodiode; an intrinsic layer 151 can be intrinsic amorphous silicon serving as an I-layer of the PIN photodiode; and a second conductive type conduction layer 161 can be p-type amorphous silicon serving as a P-layer of the PIN photodiode. Of course, embodiments are not limited thereto. For example, the first conductive type conduction layer 141 can be p-type amorphous silicon serving as a P-layer of an N-I-P photodiode, and the second conductive type conduction layer 161 can be n-type amorphous silicon serving as an N-layer of the N-I-P photodiode.

A method of fabricating the photodiode will be described below.

Figure 3:
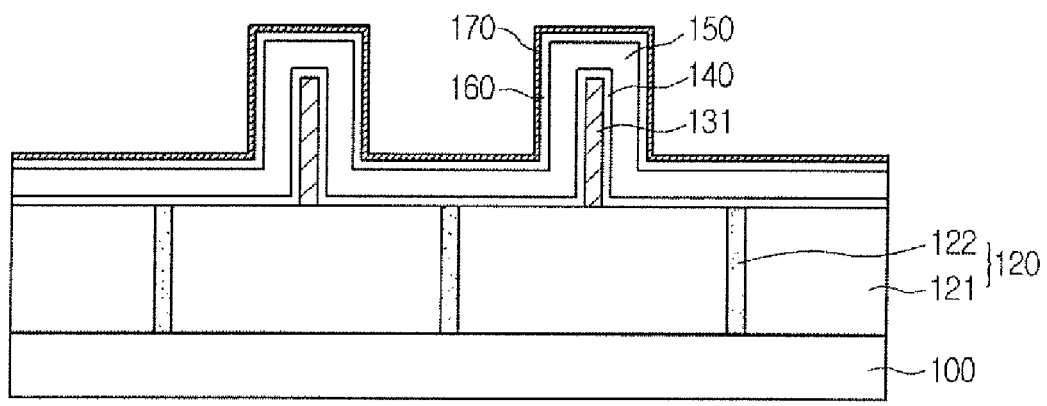

Referring to FIG. 3, a first conductive type conduction layer material 140 can be formed on the metal interconnection layer 120 and the first pixel isolation layer 131.

The first conductive type conduction layer material 140 may serve as the n-layer of the P-I-N diode. That is, the first conductive type conduction layer material 140 may be an n-type conductive type conduction layer. However, embodiments are not limited to the n-type conductive type conduction layer.

In a specific embodiment, the first conductive type conduction layer material 140 can be formed of an n-doped amorphous silicon.

For example, the first conductive type conduction layer material 140 may be formed of a-Si:H, a-SiGe:H, a-SiC, a-SiN:H, or a-SiO:H in which the amorphous silicon is doped with Ge, C, N, or O. Of course, embodiments are not limited thereto.

The first conductive type conduction layer material 140 can be formed using a chemical vapor deposition (CVD) method such as a plasma enhanced chemical vapor deposition (PECVD) method. For example, the first conductive type conduction layer material 140 may be formed of the amorphous silicon formed using a PECVD method. In one embodiment, the PECVD method can be accomplished using silane ($SiH_4$) gas mixed with $PH_3$ or $P_2H_6$.

An intrinsic layer material 150 can be formed on the first conductive type conduction layer material 140. The intrinsic layer material 150 may serve as the I-layer.

The intrinsic layer material 150 can be formed of intrinsic amorphous silicon. The intrinsic layer material 150 may be formed using a CVD method such as a PECVD method. For example, the intrinsic layer material 150 can be formed of intrinsic amorphous silicon using a PECVD method utilizing silane ($SiH_4$) gas.

Here, the thickness of the intrinsic layer material 150 may be greater than that of the first conductive type conduction layer 141 by a factor of about ten to about one thousand. The large thickness of the intrinsic layer material 150 can be advantageous because the depletion region of the photodiode increases when the thickness of the intrinsic layer 151 increases. Therefore, many photoelectrons are advantageously generated and stored.

A second conductive type conduction layer material 160 can be formed on the intrinsic layer material 150.

The second conductive type conduction layer material 160 may serve as the p-layer of the P-I-N diode. That is, the second conductive type conduction layer material 160 may be a p-type conductive type conduction layer. However, embodiments are not limited to the p-type conductive type conduction layer.

In a specific embodiment, the second conductive type conduction layer material 160 can be formed of p-doped amorphous silicon. Of course, embodiments are not limited to the p-doped amorphous silicon.

The second conductive type conduction layer material 160 can be formed using a CVD method such as a PECVD method. For example, the second conductive type conduction layer material 160 may be formed of the amorphous silicon formed using a PECVD method. In one embodiment, the PECVD method can be accomplished using silane ($SiH_4$) gas mixed with $BH_3$ or $B_2H_6$.

A first upper electrode 170 serving as a hard mask of the photodiode can be formed on the second conductive type conduction layer material 160.

The first upper electrode 170 can be a transparent electrode having a high light transmittance and a high conductivity. For example, the first upper electrode 170 may be formed of ITO or CTO.

The first conductive type conduction layer 140, the intrinsic layer material 150, the second conductive type conduction layer material, 160 and the first upper electrode 170, which are formed on or over the first pixel isolation layer 131, also protrude upward from the metal interconnection layer 120 because the first pixel isolation layer 131 upwardly protrudes from the metal interconnection layer 120.

Figure 4:
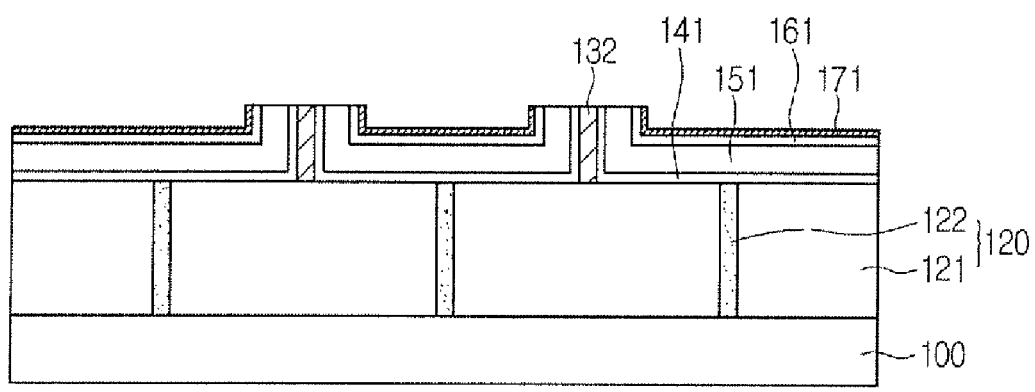

Referring to FIG. 4, the upper regions of the protruding portions of the first conductive type conduction layer 140, the intrinsic layer material 150, the second conductive type conduction layer material, 160 and the first upper electrode 170, and an upper region of the first pixel isolation layer 131 can be etched to expose a top surface of the first pixel isolation layer (now referred to as reference 132). In the etch process exposing the first pixel isolation layer 132 and removing a portion of the PIN materials (140, 150, 160) and first upper electrode material 170, photoresist patterns (not shown) can be provided on the first upper electrode material 170. The photoresist patterns expose a region of the first upper electrode material 170 corresponding to the first pixel isolation layer 132.

The materials of the exposed region are etched away, including the upper region of the first pixel isolation layer 132, using the photoresist patterns as an etch mask. The etching can be performed while ensuring that height differences remain for the materials of the photodiode and the first upper electrode (now referred to as reference 171) between the first pixel isolation layers 132. The photodiode is separated according to unit pixel using the first pixel isolation layer 132.

That is, the photodiode is separated by the unit pixel defined by the first pixel isolation layer 132. Here, the photodiode includes a first conductive type conduction layer 141, an intrinsic layer 151, and a second conductive type conduction layer 161 between the first pixel isolation layers 132. The first conductive type conduction layer 141 is connected to the metal interconnection 122 separated according to unit pixel. The first upper electrode 171 formed on the photodiode is also separated according to unit pixel using the first pixel isolation layer 131.

Accordingly, since the photodiode, in this case having the P-I-N structure, is formed over the semiconductor substrate 100, a fill factor may be increased to almost 100% by vertically stacking the transistor circuit and the photodiode.

Since the photodiode is separated by the unit pixel using the first pixel isolation layer 132, adjacent unit pixels are insulated from each other to inhibit crosstalk between the adjacent pixels. Therefore, the reliability of the image sensor can be improved.

In addition, since the photodiode has a height difference by being formed along the sidewalls of the first pixel isolation layer 131, a larger light receiving surface area is available.

Since the first upper electrode material 170 is formed on the unit pixel region of the photodiode before performing the etching process, interfacial damage of the photodiode can be minimized to reduce leakage current.

Figure 5:
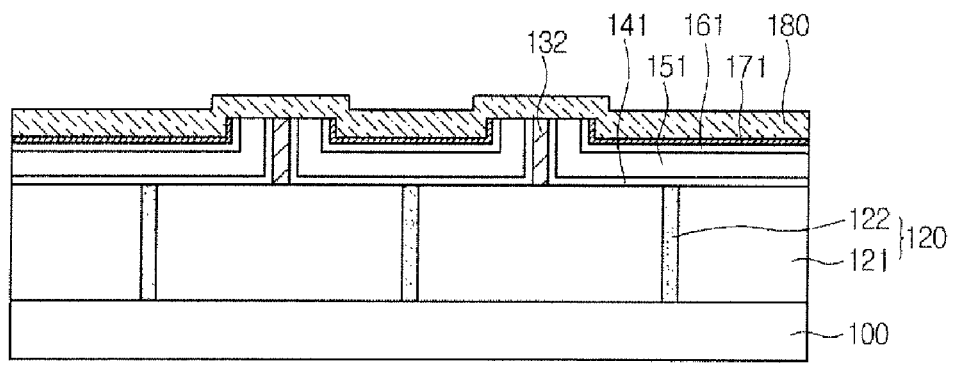

Referring to FIG. 5, an insulating layer 180 can be formed on the semiconductor substrate 100 including the photodiode (141, 151, 161), the first upper electrode 171, and the first pixel isolation layer 132. In certain embodiments, the insulating layer 180 can be formed of an oxide layer or a nitride layer.

Referring to FIG. 6, photoresist patterns (not shown) can be formed on the insulating layer 180. The photoresist patterns expose a portion of the insulating layer 180 on a region of the first upper electrode 171 corresponding to the metal interconnection 122. The exposed insulating layer 180 can be etched using the photoresist patterns as an etch mask.

Accordingly, an opening 185 is formed in the insulating layer 180. The opening 185 exposes the region of the upper electrode 171 corresponding to the metal interconnection 122. The remaining portion of the insulating layer 180 forms a second pixel isolation layer 181. The second pixel isolation layer 181 remains such that it covers the protruded portions of the photodiode region including the first pixel isolation layer 132 and the first upper electrode 171. Particularly, when the second pixel isolation layer 181 is formed, the first upper electrode 171 serves as a hard mask for the material layers of the photodiode to minimize the interfacial damage of the photodiode.

The second pixel isolation layer 181 covers a region which protrudes over the metal interconnection layer 120, that is, the protruded photodiode region and the first upper electrode 171 around the first pixel isolation layer 132 to secure insulation between unit pixels and thus further isolate devices.

Referring to FIG. 7, a second upper electrode 175 can be formed over the semiconductor substrate 100 including the first upper electrode 171 and the second pixel isolation layer

181. The second upper electrode 175 is connected to the first upper electrode 171 through the opening 185.

The second upper electrode 175 can be a transparent electrode which has high light transmittance and high conductivity. For example, the second upper electrode 175 can be formed of the ITO or the CTO. Thereafter, although not shown in the figures, the second upper electrode 175 can be patterned.

Although not shown, a color filter and a microlens may be formed on the second upper electrode 175.

According to embodiments of the image sensor and the method of fabricating the same, the transistor circuit and the photodiode can be vertically stacked.

In many embodiments, the fill factor can increase to almost 100% by vertically stacking the transistor circuit and the photodiode.

The sensitivity of the image sensor of an embodiment can be higher than that of a related art image sensor having the same pixel size by vertically stacking the transistor circuit and the photodiode.

According to an embodiment, the fabricating cost of the image sensor can be less than that of a related art image sensor having the same resolution.

According to many embodiments, each unit pixel can have a more complicated circuit without reducing the sensitivity of the image sensor.

Furthermore, since the transistor circuit and the photodiode can be vertically stacked, adjacent unit pixels can be insulated from each other to inhibit crosstalk between the adjacent pixels. Therefore, the reliability of the image sensor of certain embodiments is improved.

According to an embodiment, when the unit pixel of the photodiode is formed by an etching process, an electrode layer can serve as the hard mask of the photodiode to minimize the interfacial damage of the photodiode, thereby improving image quality.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
    a semiconductor substrate including a circuit region;
    a metal interconnection layer comprising a metal interconnection and an interlayer dielectric on the semiconductor substrate;
    a plurality of first pixel isolation layers on the interlayer dielectric, each of the first pixel isolation layers protruding above a surface of the interlayer dielectric;
    a light receiving portion between the first pixel isolation layers and electrically connected to the metal interconnection, wherein the light receiving portion comprises protruding regions along sidewalls of the first pixel isolation layers;
    a first upper electrode on the light receiving portion; and
    a plurality of second pixel isolation layers on the first pixel isolation layers and the light receiving portion, the second pixel isolation layers being separated from each other to selectively expose regions of the first upper electrode.

2. The image sensor according to claim 1, wherein the light receiving portion comprises:
    a first conductive type conduction layer on the sidewalls and between the first pixel isolation layers;
    an intrinsic layer on the first conductive type conduction layer; and
    a second conductive type conduction layer on the intrinsic layer.

3. The image sensor according to claim 2, wherein the protruding regions of the light receiving portion include portions of the first conductive type conduction layer, the intrinsic layer, and the second conductive type conduction layer.

4. The image sensor according to claim 2, wherein the first upper electrode is on the second conductive type conduction layer.

5. The image sensor according to claim 4, wherein a portion of the first upper electrode protrudes to a height of the protruding regions of the light receiving portion.

6. The image sensor according to claim 2, wherein the light receiving portion comprises a P-I-N diode or an N-I-P diode.

7. The image sensor according to claim 1, wherein the light receiving portion comprises an I-P diode.

8. The image sensor according to claim 1, wherein a portion of the first upper electrode protrudes to a height of the protruding regions of the light receiving portion.

9. The image sensor according to claim 1, wherein the first pixel isolation layers and the second pixel isolation layers comprise oxide layers or nitride layers.

10. The image sensor according to claim 1, further comprising a second upper electrode over the semiconductor substrate including the second pixel isolation layers and the first upper electrode.

11. The image sensor according to claim 10, wherein the first upper electrode and the second upper electrode are formed of the same material.

12. The image sensor according to claim 11, wherein the first upper electrode and the second upper electrode comprise transparent electrodes.

13. A method of fabricating an image sensor according to claim 1, comprising: forming the metal interconnection layer including the metal interconnection and the interlayer dielectric on the semiconductor substrate including the circuit region; forming the plurality of first pixel isolation layers on the interlayer dielectric; forming the light receiving portion between the first pixel isolation layers, wherein the light receiving portion comprises the protruding regions along the sidewalls of the first pixel isolation layers; forming the first upper electrode on the light receiving portion; and forming the plurality of second pixel isolation layers.

14. The method according to claim 13, wherein the forming of the light receiving portion comprises:
   forming a first conductive type conduction layer material on the metal interconnection layer and the first pixel isolation layers;
   forming an intrinsic layer material on the first conductive type conduction layer material; and
   forming a second conductive type conduction layer material on the intrinsic layer material.

15. The method according to claim 14, further comprising:
   forming the first upper electrode on the light receiving portion by forming a first upper electrode material on the second conductive type conduction layer material; and
   etching the first conductive type conduction layer material, the intrinsic layer material, the second conductive type conduction layer material, and the first upper electrode material on the first pixel isolation layer to expose a top surface of the first pixel isolation layer.

16. The method according to claim 13, further comprising:
   forming a second upper electrode over the semiconductor substrate including the second pixel isolation layer.

17. The method according to claim 16, wherein the first upper electrode and the second upper electrode comprise transparent electrodes.

18. The method according to claim 13, wherein the plurality of first pixel isolation layers and the plurality of second pixel isolation layers are formed of oxide layers or nitride layers.

* * * * *